United States Patent [19]

Bean

[11] Patent Number: 4,737,470
[45] Date of Patent: Apr. 12, 1988

[54] METHOD OF MAKING THREE DIMENSIONAL STRUCTURES OF ACTIVE AND PASSIVE SEMICONDUCTOR COMPONENTS

[75] Inventor: Kenneth E. Bean, Richardson, Tex.
[73] Assignee: Texas Instruments Incorporated, Dallas, Tex.
[21] Appl. No.: 907,184
[22] Filed: Sep. 12, 1986

Related U.S. Application Data

[62] Division of Ser. No. 684,197, Dec. 19, 1984, Pat. No. 4,663,648.

[51] Int. Cl.⁴ .......................................... H01L 21/302
[52] U.S. Cl. ...................................... 437/38; 437/47; 437/51; 437/225; 437/249; 437/935; 437/915; 156/647
[58] Field of Search ............... 29/580; 148/DIG. 115; 357/60, 55; 156/647

[56] References Cited

U.S. PATENT DOCUMENTS

| | | | |
|---|---|---|---|
| 3,579,057 | 5/1971 | Stoller | 357/60 |
| 3,893,228 | 7/1975 | George et al. | 357/60 |
| 3,936,329 | 2/1976 | Kendall et al. | 156/647 |
| 3,962,713 | 6/1976 | Kendal et al. | 357/60 |
| 3,969,746 | 7/1976 | Kendal et al. | 357/60 |
| 4,017,885 | 4/1977 | Kendall et al. | 357/60 |
| 4,065,742 | 12/1977 | Kendall et al. | 357/60 |
| 4,069,463 | 1/1978 | McGroddy | 357/60 |
| 4,353,086 | 10/1982 | Jaccodine et al. | 357/23.6 |

OTHER PUBLICATIONS

Benjamin, "Forming Semiconductor Structures", IBM-TDB, vol. 9, No. 1, Jun. 1966, p. 93.
Beam, "Influence of Crystal Orientations on Silicon Semiconductor Processing", Proc. of IEEE, vol. 57, No. 9, Sep. 1969-pp. 1469-1476.

Primary Examiner—Brian E. Hearn
Assistant Examiner—Tom Thomas
Attorney, Agent, or Firm—Carlton H. Hoel; Leo N. Heiting; Melvin Sharp

[57] ABSTRACT

The disclosure relates to a three dimensional semiconductor structure formed in a semiconductor substrate wherein electrical components, both active and passive, are formed on the substrate surface as well as in grooves formed in the substrate at an angle and extending to the surface. The substrate surface is designed to lie in a predetermined crystallographic plane of the substrate material and the grooves extend in a predetermined crystallographic direction from said plane, this being accomplished by orientation dependent etching.

12 Claims, 3 Drawing Sheets

METHOD OF MAKING THREE DIMENSIONAL STRUCTURES OF ACTIVE AND PASSIVE SEMICONDUCTOR COMPONENTS

This application is a division of application Ser. No. 684,197 filed Dec. 19, 1984, now U.S. Pat. No. 4,663,648.

BACKGROUND OF THE INVENTION

1. Field of the Invention

This invention relates to semiconductor integrated circuit structure and, more specifically, to structures formed on semiconductor devices, both active and passive, which are disposed on the surface of the substrate as well as in grooves having a component normal to the substrate and within the substrate itself.

2. Brief Description of the Prior Art

In the prior art, semiconductor devices such as transistors, integrated circuits and the like are generally formed utilizing a single top surface of the semiconductor substrate for formation of both active and passive components such as metal leads, resistors, capacitors and the like. In fact, the amount of the semiconductor material presently used, to perform semiconductor functions, in the two dimensional structure approaches amounts to a very small percentage of the total semiconductor substrate available. In addition, in the present state of the art, non-semiconductor components such as the metal leads, resistors, capacitors and the like occupy approximately 60% of the semiconductor chip surface area utilized. It is therefore readily apparent that semiconductor substrates as produced in accordance with the prior art and the present state of the art are highly inefficient in their use of the available substrate volume.

It is also known in the art that high component packing densities are very advantageous and the art is continually striving to increase the component packing density. However, it is clear that, as component packing densities increase, improvements thereof may ultimately show a rate decline due to possible physical phenomenon limitations or the like. It is therefore readily apparent from the above that, if major gains in component packing density are to continue to be achieved, such major gains must result from procedures and approaches other than those utilized in the present state of the art for increasing component packing density.

BRIEF DESCRIPTION OF THE INVENTION

In accordance with the present invention, there is provided a new approach for increasing the number of components on a semiconductor chip of predetermined dimension relative to the prior art methods. Briefly, in accordance with the present invention, grooves are formed in the semiconductor substrate at an angle to the substrate surface on which components are normally formed and extending to that surface. Preferably, such grooves are formed along particular crystallographic planes of the semiconductor material and will make an angle with the substrate surface in accordance with the particular crystallographic plane along which preferential etching takes place. For example, if preferential etching takes place along the <111> direction in silicon and normal to the (110) plane forming the substrate surface, grooves will be formed at an angle of 90 degrees to the substrate surface. If etching takes place in other crystallographic directions, angles with the substrate surface of other well known values will take place. The result will be that the available surface area upon which components, both active and passive, can be formed can be increased by a factor of one hundred or more.

By using the crystallographic anisotropic properties of the semiconductor material, (110) silicon, for example, and orientation dependent etching and deposition, non-semiconducting elements as well as semiconducting elements can be placed in the third dimension, vertically or having a vertical component (into the substrate material). This process can also be achieved by the use of very narrow kerf saws, ion milling, plasma etching, etc., as is well known in the art. The available surface area for active semiconductor components, transistors, diodes, etc. is thereby increased by orders of magnitude by the use of orientation dependent etching. Through the use of photolithography and (110) orientation dependent etching there can be developed, for example, one micron wide lines on two micron centers of masking material such as silicon dioxide or silicon nitride, on the (110) silicon and etch 100 microns deep into the <110> direction of the substrate without measurable undercutting. This increases the available silicon surface area for the formation of active elements as well as passive elements by a factor of about two hundred. If etching takes place 200 microns deep, the factor goes up to about a four hundredfold increase, etc. With the technology in the present state of the art, there is no problem in etching sub-micron grooves and ridges into the (110) silicon. These grooves can also be oxidized through the use of normal oxidation processing and diffusions can be readily made both vertically and horizontally into the structures. With the use of present day known technology such as e-beam, x-ray and tunable sensitive resists, ion bea and cluster ion implantation, laser, infrared and electron beam activation, it is now possible to fabricate active devices in the side walls of the structures, thus providing the ability to fabricate very high packing density, very large memory structures and the like on semiconductor chips of the same size as are presently being used with substantially lower packing densities.

The structure as described above not only gives rise to extremely large increases in available area for component fabrication, but also provides a natural means for high power thermal dissipation by passing air, conductive gas or liquid through the grooves formed in the substrate for thermal cooling. The novel structure described above also provides a natural means for complete isolation of the devices within a circuit by driving the isolation diffusion completely through the thin ridges between grooves which are formed in the substrate during or prior to formation of the components thereon.

DESCRIPTION OF THE PREFERRED EMBODIMENT

Figure 1:
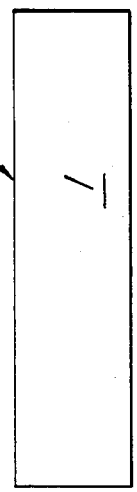
FIG. 1 is a cross-sectional view of a substrate prior to processing thereof in accordance with the present invention.
Figure 2:
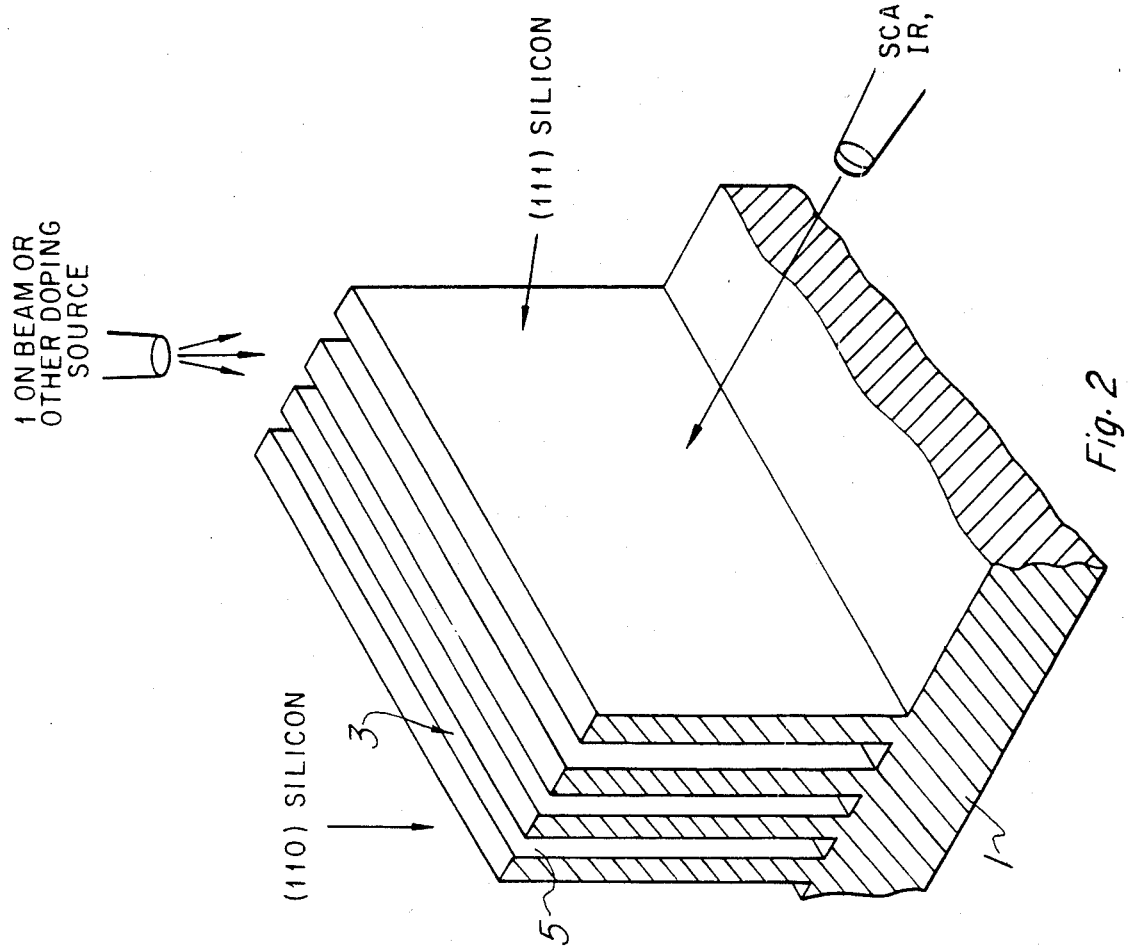
FIG. 2 is a perspective view of a three dimensional structure utilizing the processing techniques in accordance with the present invention for groove formation.

Referring now to the figures, FIG. 1 shows a standard semiconductor substrate 1, which will be described with reference to silicon substrates, it being understood that other crystallographic semiconductor substrates can be utilized with appropriate alterations in the procedures and results as described hereinabove and hereinbelow as are well know to those skilled in the art. The silicon substrate 1 is arranged so that the (110) plane 3 forms the top surface of the substrate, it being understood that, if certain other crystallographic planes formed the top surface, the results as described hereinbelow would be obtained with some alterations thereto. In the prior art, semiconductor components, both active and passive, are formed substantially only on the surface 3 and extend only a very small distance into the semiconductor substrate 1 with most of the substrate having no function other than as a support element thereby essentially wasting the unused substrate portion. In accordance with the present invention, a much greater portion of the substrate is utilized for formation of both active and passive semiconductor components. This is accomplished by appropriately masking the top surface 3 of the substrate and then etching the substrate 1 with an orientation dependent etch so that grooves 3 as shown in FIG. 2 are formed, thereby forming and exposing additional substrate surfaces 5 on which the components can be formed. These grooves 3 can take any shape desired, this being merely dependent upon the masking utilized prior to etching and the particular etchant utilized. It should also be understood that etching can take place along directions other than <111> as utilized herein in the preferred embodiment whereby the grooves 3, which are formed, rather than being normal to the (110) plane will take angles other than ninety degrees thereto as is well known. These other orientation dependent etch directions are also included herein as a part of this invention, either singly or in combination with other groove etching directions, whereby several different orientation dependent etches can be used for etching on the same substrate. It can be seen with reference to FIG. 2 that the substrate appears in the form of a surface with a plurality of separated buildings extending therefrom but secured thereto and forming a part thereof. It can also readily be seen from FIG. 2 that the amount of available surface area formed by the orientation dependent etch can be many times the originally available area on the surface of the substrate.

Figure 3:
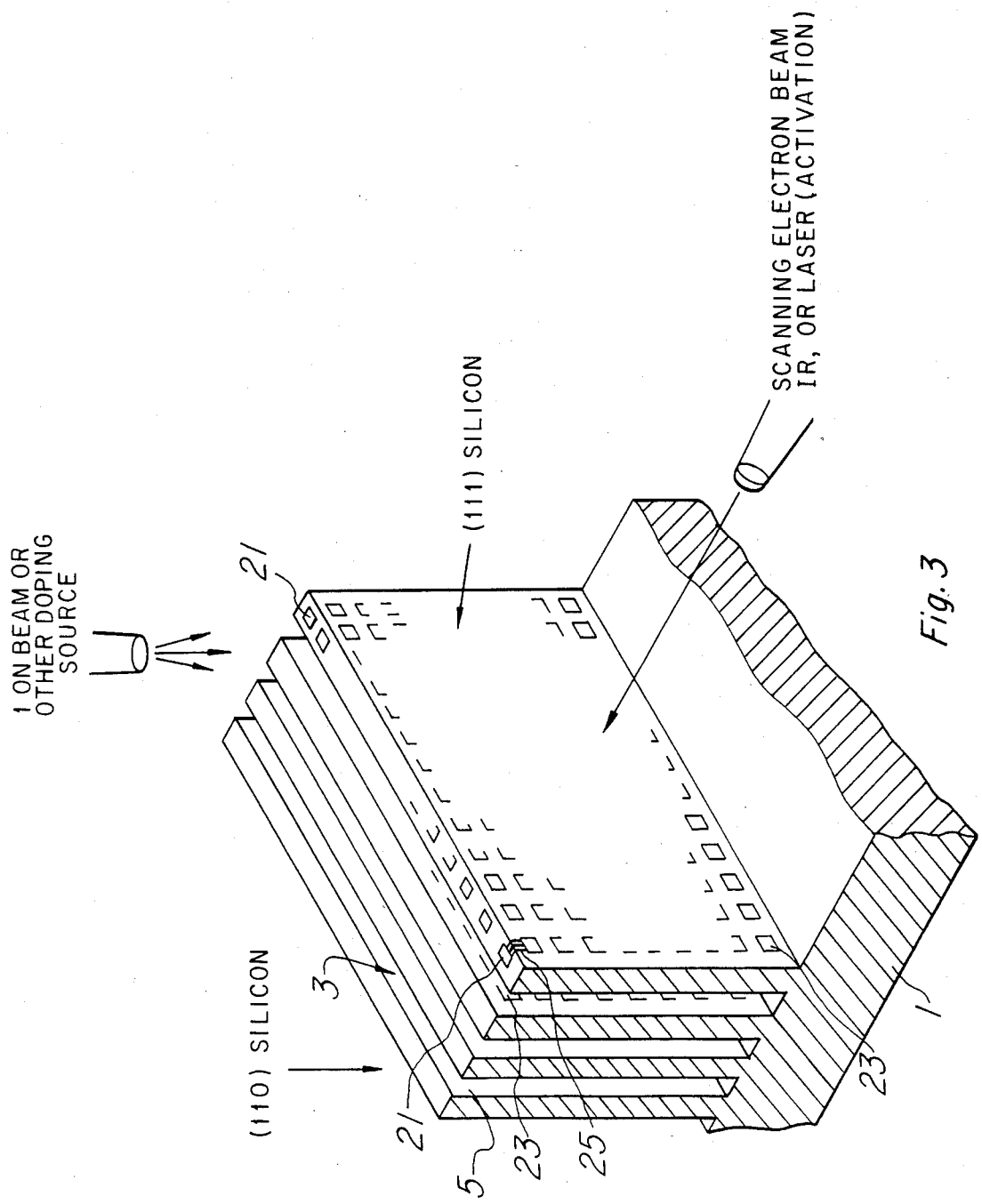
FIG. 3 is a view as in FIG. 2 with components formed on the substrate surface and in the grooves.

Referring now to FIG. 3, there is shown a completed three dimensional semiconductor structure with components, both active and passive, formed thereon. It can be seen that components 7 are formed on what was originally the top surface 3 of the substrate 1, these preferably being active components rather than passive components, though this is not a requirement. In addition, it can be seen that components 9 have been formed in the groove areas which can be interconnected to other components on the substrate, either in the grooves or on the original surface 3, in standard manner as is well known in the present state of the art.

In the formation of components on the substrate, masking can take place, if desired, in standard manner with photoresist on the top surface or by the formation of oxides on all of the surfaces, such as by placing the substrate in a thermal oxidation tube or by gaseous diffusion and oxidation therefrom. Components can be formed in the grooves by shadow casting depositions as are well known in the art. Such shadow casting depositions can be directed to go into, for example, a two micron wide groove as far as 80 microns and possibly more beneath the former substrate surface 3. The semiconductor surfaces within the grooves 3 can also be preferentially doped by ion beam or by placing desired ions in the atmosphere surrounding the substrate and within the grooves and directing a laser beam to those spots wherein it is desired that these ions penetrate the substrate to provide the doping action. the ions will penetrate the semiconductor substrate only in those locations to which the laser beam or ion beam is directed. By these techniques, as described hereinabove, both active and passive semiconductor components as well as metallization can readily be formed within the grooves and at depths sufficient to provide orders of magnitude increase in available surface area for formation of components.

As a specific example of a circuit portion that can be formed in three dimensions and with reference to FIG. 3, the entire substrate is initially oxidized in a thermal oxidation tube. The entire surface is masked with a photoresist which is then selectively removed with a laser beam and the oxide is removed by etching in those regions where the resist is removed. This procedure is only performed on the former surface 3. Transistors 21 are then formed in standard manner in the regions wherein the oxide was removed. The resist and oxide are removed. The substrate is then placed in a chamber containing N-type ions and a laser beam directs these ions into the exposed substrate in the grooves 3 as at area 23 to form an N-type region therein. The chamber is evacuated and P-type ions are placed therein and directed to the area 23 by a laser to form a diode at 23. Metallization 25 is now formed between a transistor 21 and the diode 23 by shadow casting deposition to form a circuit.

Though the invention has been described with respect to a specific preferred embodiment thereof, many variations and modifications will immediately become apparent to those skilled in the art. It is therefore the intention that the appended claims be interpreted as broadly as possible in view of the prior art, to include all such variations and modifications.

What is claimed is:

1. A method of forming a three dimensional semiconductor structure comprising the steps of:
    (a) providing a semiconductor substrate having a surface defining a predetermined crystallographic plane of said substrate;
    (b) etching grooves extending to said surface and defined by walls in said substrate in a predetermined crystallographic direction of said substrate;
    (c) forming a first semiconductor component on said surface;
    (d) forming a second semiconductor component on a said wall; and
    (e) electrically interconnecting said first semiconductor component and said second semiconductor component.

2. A method as set forth in claim 1 wherein said said second semiconductor component extends into said wall.

3. A method as set forth in claim 1 wherein said connecting means is disposed on at least one of said walls and said surface.

4. A method as set forth in claim 2 wherein said connecting means is disposed on at least one of said walls and said surface.

5. A method as set forth in claim 1 wherein said crystallographic plane is (110).

6. A method as set forth in claim 2 wherein said crystallographic plane is (110).

7. A method as set forth in claim 3 wherein said crystallographic plane is (110).

8. A method as set forth in claim 4 wherein said crystallographic plane is (110).

9. A method as set forth in claim 5 wherein said crystallographic direction is (110).

10. A method as set forth in claim 6 wherein said crystallographic direction is (110).

11. A method as set forth in claim 7 wherein said crystallographic direction is (110).

12. A method as set forth in claim 8 wherein said crystallographic direction is (110).

* * * * *